(12) United States Patent
Sethuraman

(10) Patent No.: US 8,832,169 B2
(45) Date of Patent: Sep. 9, 2014

(54) REDUCING STEADY STATE ERROR IN FIXED POINT IMPLEMENTATIONS OR RECURSIVE FILTERS

(75) Inventor: Vignesh Sethuraman, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 411 days.

(21) Appl. No.: 13/293,498

(22) Filed: Nov. 10, 2011

(65) Prior Publication Data

US 2012/0207200 A1     Aug. 16, 2012

Related U.S. Application Data

(60) Provisional application No. 61/443,496, filed on Feb. 16, 2011.

(51) Int. Cl.
  G06F 17/10 (2006.01)
  H03H 17/02 (2006.01)
  H03H 17/04 (2006.01)

(52) U.S. Cl.
  CPC ....... *H03H 17/0219* (2013.01); *H03H 17/0461* (2013.01); *H03H 2017/022* (2013.01)
  USPC ...................................................... 708/320

(58) Field of Classification Search
  None
  See application file for complete search history.

(56) References Cited

U.S. PATENT DOCUMENTS

| | | | |
|---|---|---|---|
| 4,823,296 A | 4/1989 | Millar | |
| 5,479,922 A * | 1/1996 | Reichl | 600/300 |
| 5,923,576 A | 7/1999 | Hajdu et al. | |
| 6,778,955 B2 | 8/2004 | Li et al. | |
| 6,804,313 B2 | 10/2004 | Skafidas et al. | |
| 7,209,938 B2 | 4/2007 | Lipp | |
| 7,586,982 B2 | 9/2009 | Nguyen et al. | |
| 7,894,512 B2 | 2/2011 | Beadle et al. | |
| 2004/0062217 A1 | 4/2004 | Abrishamkar et al. | |
| 2006/0218213 A1* | 9/2006 | Shehata et al. | 708/300 |
| 2010/0027603 A1* | 2/2010 | Beadle et al. | 375/226 |
| 2012/0207200 A1* | 8/2012 | Sethuraman | 375/227 |

OTHER PUBLICATIONS

Davis et al., "Using Matlab to analyse finite word length effects in infinite impulse response digital filters", Apr. 20, 1998, pp. 2/1-2/8, XP006503355.

Dehner: "Noise optimized IIR digital filter design: tutorial and some new aspects", Signal Processing, Aug. 1, 2003, pp. 1565-1582, vol. 83, No. 8, Elsevier Science Publishers, XP004433464, ISSN: 0165-1684, DOI: 10.1016/50165-1684(03)00075-6.

(Continued)

*Primary Examiner* — David H Malzahn
(74) *Attorney, Agent, or Firm* — S. Hossain Beladi

(57) ABSTRACT

One feature includes a method for implementing a fixed point recursive filter that reduces or eliminates steady state error. The method comprises obtaining a first filter state value, processing the first filter state value to remove a scaling factor to obtain a second filter state value, ascertaining that the recursive filter has reached a steady state, determining a nonlinear drift parameter based on a difference between the first filter state value and the second filter state value multiplied by the scaling factor, and adjusting the second filter state value with the nonlinear drift parameter to reduce steady state error of the recursive filter. Ascertaining that the recursive filter has reached the steady state may include determining that a filter output value at time n is equal to a filter output value at time n−1.

22 Claims, 10 Drawing Sheets

(56) References Cited

OTHER PUBLICATIONS

International Search Report and Written Opinion—PCT/US2012/025288—ISA/EPO—Jul. 5, 2012.

Oruklu et al., "Hardware-efficient realization of a real-time ultrasonic target detection system using IIR filters", IEEE Transactions on Ultrasonics, Ferroelectrics and Frequency Control, Jun. 1, 2009, pp. 1262-1269, vol. 56, No. 6, IEEE, XP011269569, ISSN: 0885-3010, DOI: 10.1109/TUFFC.2009.1168.

* cited by examiner

REDUCING STEADY STATE ERROR IN FIXED POINT IMPLEMENTATIONS OR RECURSIVE FILTERS

CLAIM OF PRIORITY

The present application for patent claims priority to U.S. Provisional Patent Application No. 61/443,496 entitled "Reducing Steady State Error in Fixed Point Implementations of Recursive Filters" filed Feb. 16, 2011, the entire disclosure of which is hereby expressly incorporated by reference herein.

BACKGROUND

1. Field

One feature relates to digital filters, and more particularly, to methods and devices for reducing steady state error in fixed point recursive filters.

2. Background

In signal processing, a recursive filter is a type of filter that re-uses one or more of its outputs as an input. This feedback typically results in an unending impulse response (commonly referred to as infinite impulse response (IIR)), characterized by either exponentially growing, decaying, or sinusoidal signal output components. Therefore, recursive filters may also be known as infinite impulse response filters (IIR filters). FIGS. 1 and 2 illustrate single-tap 100 and two-tap 200 recursive filters, respectively, found in the prior art.

Floating point recursive filters may eventually converge to an output value having no steady state error. That is, the final output value of the floating point recursive filter equals the expected value without non-linear deviation. However, floating point implementations are computationally expensive and may be impractical in many applications. Thus, fixed point implementations of recursive filters are often needed in many applications due to time and power constraints. However, due to the limited bit-width, fixed point recursive filters exhibit non-linear behavior at certain operating points. In addition to the expected quantization and saturation effects, fixed point implementations suffer from non-zero steady state error. This is a limitation that can significantly impact devices, such as a mobile phone, that may use the recursive filter to estimate the signal to noise ratio of a downlink channel.

Therefore, there is a need to eliminate or at least reduce the non-zero steady state errors of fixed point recursive filters.

SUMMARY

One feature provides a method for implementing a recursive filter that comprises obtaining a first filter state value, processing the first filter state value to remove a scaling factor to obtain a second filter state value, ascertaining that the recursive filter has reached a steady state, determining a nonlinear drift parameter based on a difference between the first filter state value and the second filter state value multiplied by the scaling factor, and adjusting the second filter state value with the nonlinear drift parameter to reduce steady state error of the recursive filter. Processing the first filter state value to obtain the second filter state value may include rounding the first filter state value after removing the scaling factor. Ascertaining that the recursive filter has reached the steady state may include determining that a filter output value at time n is equal to a filter output value at time n−1. In one aspect of the disclosure ascertaining that the recursive filter has reached the steady state includes: obtaining a first filter vector comprising a first plurality of filter values for a time n−1; obtaining a second filter vector comprising a second plurality of filter values for a time n; and determining that the first filter state vector is equal to the second filter state vector. Moreover, adjusting the second filter state value with the nonlinear drift parameter may include adding the drift parameter to the second filter state value.

In one aspect, determining the nonlinear drift parameter based on the difference between the first filter state value and the second filter state value multiplied by the scaling factor includes: setting the drift parameter equal to a bit value of positive one (1) if the first filter state value minus the second filter state value multiplied by the scaling factor is greater than zero (0); and setting the drift parameter equal to a bit value of negative one (−1) if the first filter state value minus the second filter state value multiplied by the scaling factor is less than zero (0). In another aspect, obtaining the first filter state value includes: multiplying an input value by a first coefficient to obtain a first intermediate value; multiplying a filter output value at time n−1 by a second coefficient to obtain a second intermediate value; and subtracting the second intermediate value from the first intermediate value. In yet another aspect, the recursive filter may be used in a mobile device to accurately report a CQI value to a communications network.

The recursive filter may be used in a UMTS user equipment to determine an SNR value of a communications link between the user equipment and a communications network. In one aspect, the recursive filter is a fixed point recursive filter. In another aspect, adjusting the second filter state value with the nonlinear drift parameter to reduce steady state error of the recursive filter is performed without changing the order of the recursive filter. According to one aspect of the disclosure, the method may further comprise obtaining an input value; and multiplying the input value and one or more filter coefficients to obtain one or more intermediate values. Moreover, the method may comprise combining the one or more intermediate values to generate the first state value.

Another feature provides a recursive filter comprising a processing circuit adapted to: obtain a first filter state value; process the first filter state value to remove a scaling factor to obtain a second filter state value; ascertain that the recursive filter has reached a steady state; determine a nonlinear drift parameter based on a difference between the first filter state value and the second filter state value multiplied by the scaling factor; and adjust the second filter state value with the nonlinear drift parameter to reduce steady state error of the recursive filter.

Another feature provides a recursive filter comprising a means for obtaining a first filter state value, a means for processing the first filter state value to remove a scaling factor to obtain a second filter state value, a means for ascertaining that the recursive filter has reached a steady state, a means for determining a nonlinear drift parameter based on a difference between the first filter state value and the second filter state value multiplied by the scaling factor, and a means for adjusting the second filter state value with the nonlinear drift parameter to reduce steady state error of the recursive filter.

Another feature provides a computer readable medium having instructions stored thereon for implementing a recursive filter, which when executed by one or more processors causes the processor to: obtain a first filter state value; process the first filter state value to remove a scaling factor to obtain a second filter state value; ascertain that the recursive filter has reached a steady state; determine a nonlinear drift parameter based on a difference between the first filter state value and the second filter state value multiplied by the scaling factor;

and adjust the second filter state value with the nonlinear drift parameter to reduce steady state error of the recursive filter.

BRIEF DESCRIPTION OF THE DRAWINGS

The features, nature, and advantages of the present disclosure may become more apparent from the detailed description set forth below when taken in conjunction with the drawings in which like reference characters identify correspondingly throughout.

DETAILED DESCRIPTION

In the following description, specific details are given to provide a thorough understanding of the aspects of the disclosure. However, it will be understood by one of ordinary skill in the art that the aspects disclosed may be practiced without these specific details. For example, circuits may be shown in block diagrams, or not be shown at all, in order not to obscure the aspects in unnecessary detail. In other instances, well-known circuits, structures and techniques may not be shown in detail in order not to obscure the aspects of the disclosure.

Overview

Generally speaking, recursive filters have a non-zero steady state error in typical fixed point implementations. The magnitude of the steady state error depends on the filter coefficients. An improvement to fixed point implementations of recursive filters is herein provided by using a nonlinear drift term to reduce the non-zero steady state error. The improvement does not require more bit-width than the original fixed point linear filter. On ASIC implementations, where recursive filters are implemented in hardware, the bit-width savings also translate to power savings. The modification (e.g., using a nonlinear update term) ameliorates the nonlinear effects of quantization and rounding. This modification has no significant impact on the frequency response of the filter. The order of the filter is unchanged, and phase considerations do not have to be revisited when this modification is applied.

Exemplary Fixed-Point Recursive Filter

Figure 1:
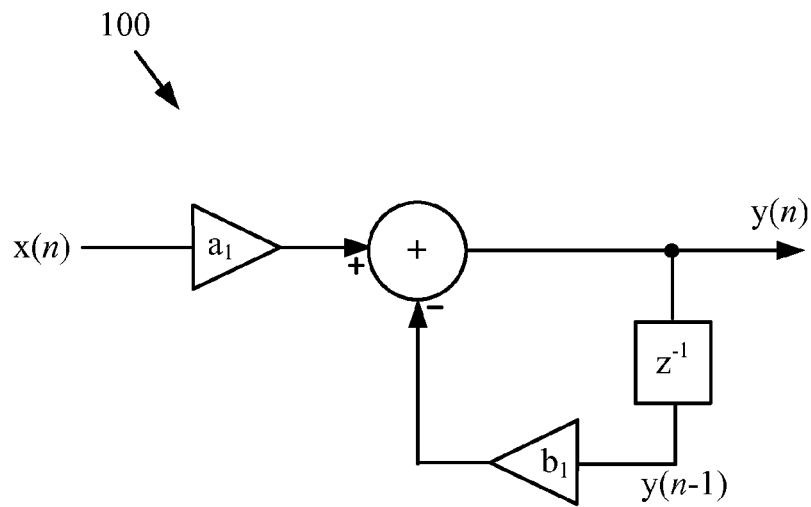
FIG. 1 illustrates an exemplary single-tap recursive filter.
Figure 2:
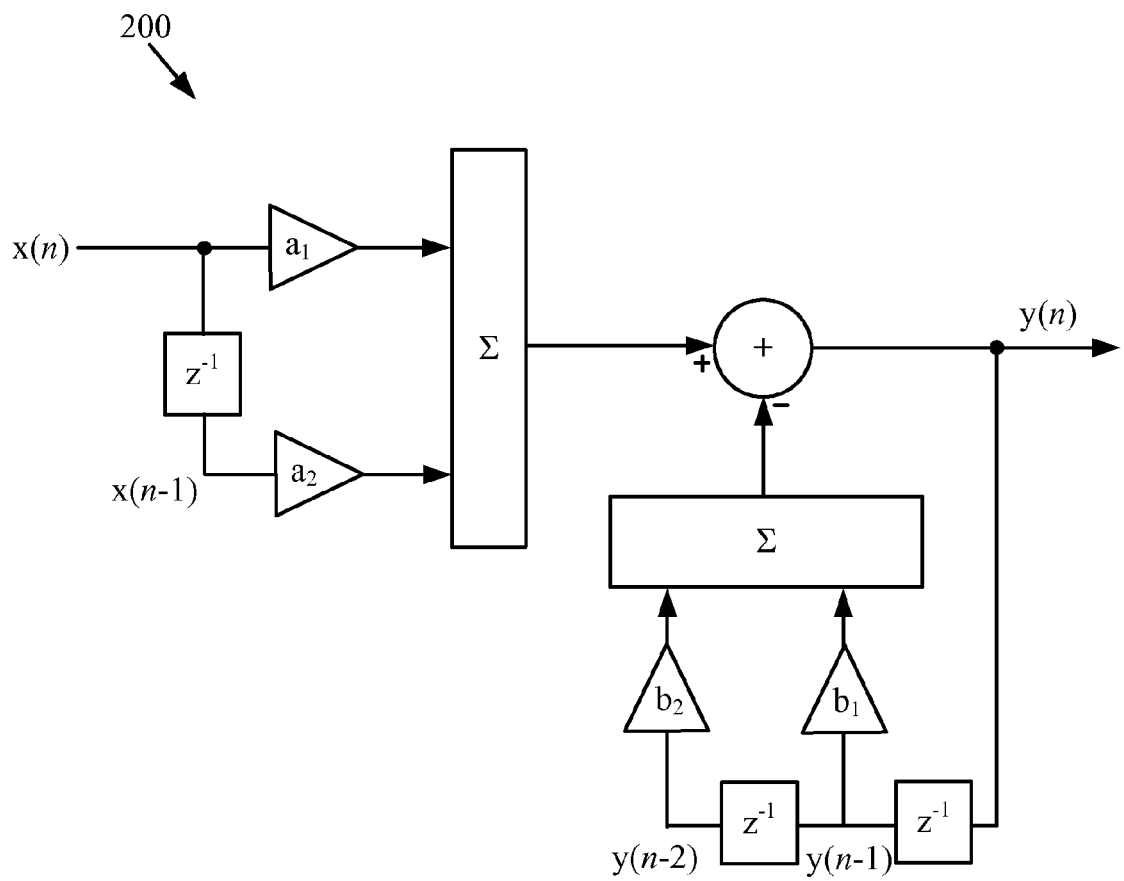
FIG. 2 illustrates an exemplary two-tap recursive filter.
Figure 3:
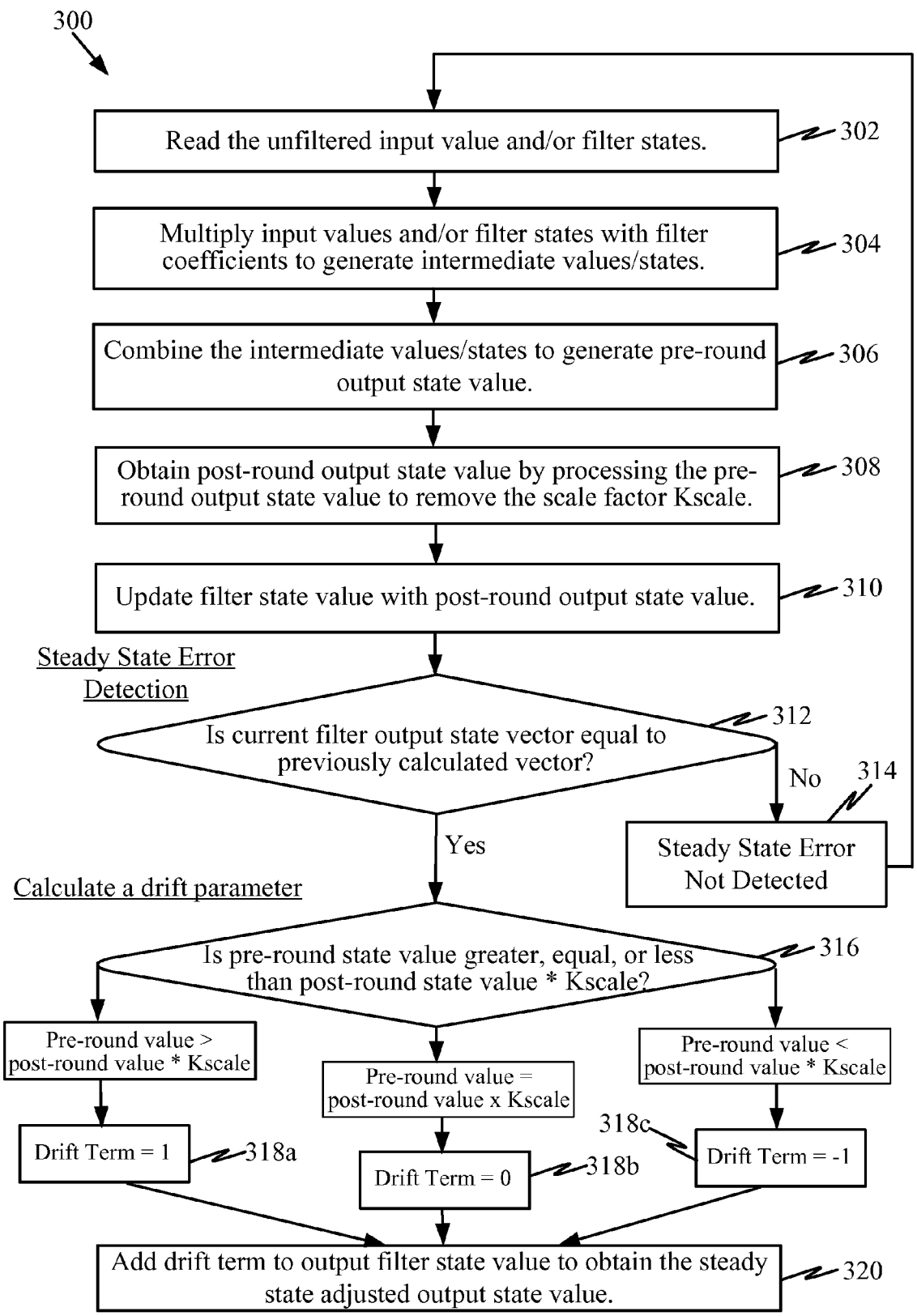
FIG. 3 illustrates a flow diagram for implementing an exemplary fixed point recursive filter that reduces a non-zero steady state error by using a nonlinear update term.

FIG. 3 illustrates a flow diagram for implementing an exemplary fixed point recursive filter that reduces a non-zero steady state error by using a nonlinear update term according to one aspect of the disclosure. First, one or more unfiltered input values and/or filter states are read/obtained 302. Then, the input values and/or filter states are multiplied with filter coefficients to generate intermediate values/states 304. The filter coefficients may be fractional values that utilize a pre-determined scale factor, $K_{scale}$, that may typically be a power of two (2) for ease of binary computation. Then, the intermediate values/states are combined to generate a pre-round output state value 306. The pre-round output state value is referred to as "pre-round" since it contains the scale factor $K_{scale}$.

A post-round output state value is obtained by processing the pre-round output state value to remove the scale factor $K_{scale}$ 308. If the scale factor $K_{scale}$ is a power of 2, this may simply include a round operation. For example, if $K_{scale}$ has a value of 1,024 (i.e., $2^{10}$), the scale factor $K_{scale}$ can be removed by rounding the 10 least significant bits out of the pre-round output state value. A filter output state value (referred to as "FOSVal") is then updated with the post-round output state value 310. I.e., at this point the filter output state value is equal to the post-round output state value.

The next step is to determine whether the filter output has settled to a steady state value. A filter output state vector (referred to as "FOSVec") at time n, $FOSVec_n$, may include a plurality of current and previously calculated filter output state values including, for example, $FOSVal_n$, $FOSVal_{n-1}$, etc. Thus, as one example, a filter output state vector at time n may be given by the equation $$FOSVec_n = [FOSVal_n, FOSVal_{n-1}],$$

and a filter output state value at time n−1 may be given by the equation $$FOSVec_{n-1} = [FOSVal_{n-1}, FOSVal_{n-2}].$$

The filter may have presumably achieved a steady state value when the two vectors $FOSVec_n$ and $FOSVec_{n-1}$ are equal to each other, and thus the current filter output state vector is equal to the previously computed filter output state vector 312. That is, identical filter output state vectors (e.g., each comprising a plurality of current and/or previous filter output state values) for consecutive iterations of the recursive filter is an indication that a steady state value has been reached. Prior to this, the recursive filter is iteratively moving toward a filter steady state value. If the two vectors $FOSVec_n$ and $FOSVec_{n-1}$ are not equal then a filter steady state has not yet been reached, and the process repeats until a steady state value is detected 314. Since fixed point recursive filters suffer from non-zero steady state errors, the steady state value detected will have a steady state error associated with it.

Next, once the filter has settled to a steady state value, a steady state error is detected/ascertained and a drift term (also referred to as a "drift parameter") is calculated. The drift term serves to iteratively move the steady state value to the correct value (i.e., to a value having a zero steady state error) by reducing the steady state error. The drift term calculation first determines whether the pre-round output state value is equal to, greater than, or less than the post-round output state value multiplied by the $K_{scale}$ value 316. If the pre-round output state value is greater than the post-round output state value multiplied by the $K_{scale}$, then the drift term is set to a value of one (1) 318a. If the pre-round output state value is equal to the post-round output state value multiplied by the $K_{scale}$ value, then the drift term is set to a value of zero (0) 318b. If the pre-round output state value is less than the post-round output state value multiplied by the $K_{scale}$ value, then the drift term is set to a value of negative one (−1) 318c. The values of one (1) and negative one (−1) of the drift parameter may represent the smallest non-zero bit value of the fixed point, digital filter implementation, i.e., they may represent a positive bit and a negative bit, respectively.

Next, the drift term is then added to the current filter output state value 320 to obtain a steady state adjusted filter output state value. In this way, a steady state filter value is adjusted to minimize or reduce the steady state error. All of the filter state values (input, intermediate, and/or output) discussed herein may be complex values that include a real component and an imaginary component.

Exemplary Recursive Filters With Steady State Error Correction

One Tap Recursive Filter

Figure 4:
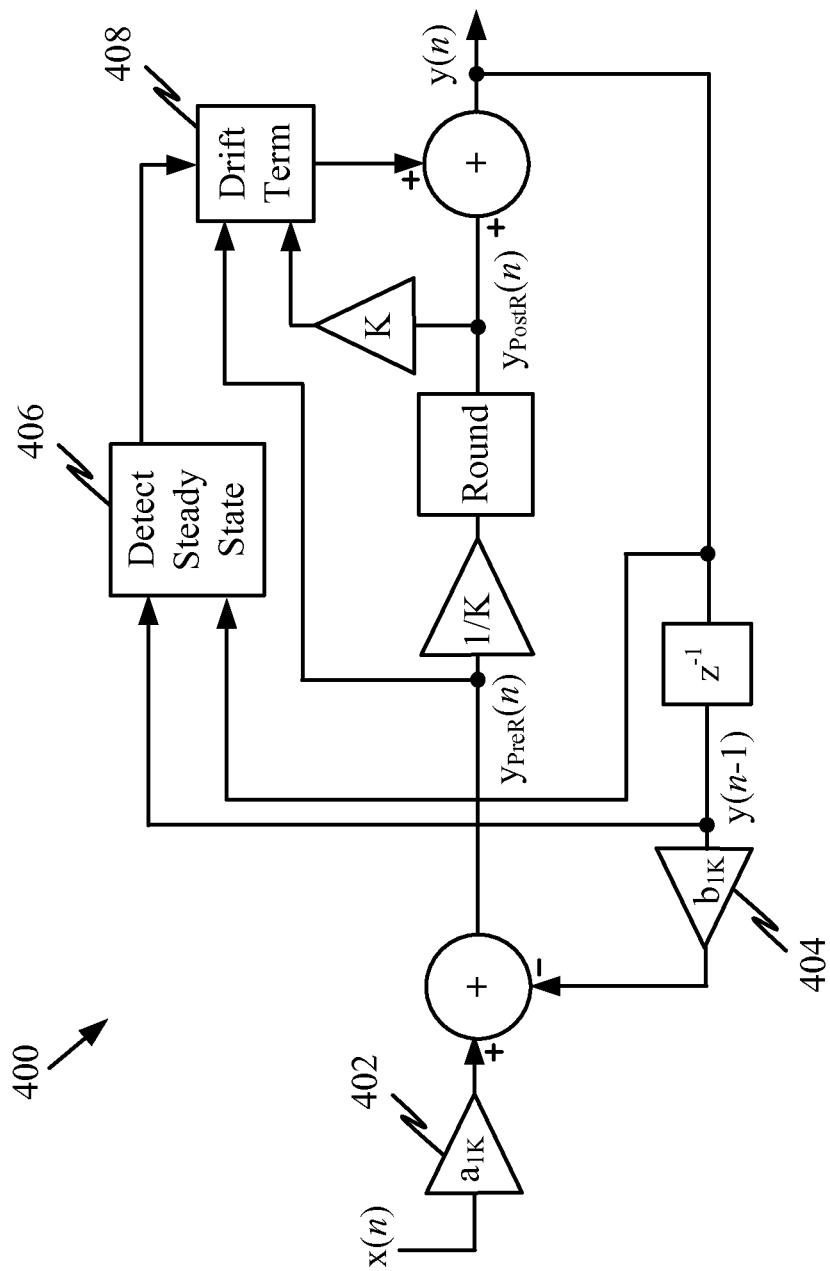
FIG. 4 illustrates an example of a single-tap recursive filter featuring steady state error correction.

FIG. 4 illustrates an example of a functional block diagram of a fixed point, one-tap (single-tap) recursive filter 400 with steady state error correction according to one aspect of the disclosure. As an example, the difference equation of a single tap recursive filter may be defined as:

$$y(n)=a_1*x(n)-b_1*y(n-1).$$

Since the filter is a single tap, the filter output state vector has only one element and is equal to the filter output state value y(n). For example, at time (n−1) the filter output state vector is the single element y(n−1).

At time n, y(n) may be calculated based on the filter output state vector at time (n−1) and the input x(n). Referring to FIG. 4, since the filter coefficients $a_1$, $b_1$ may be less than one (1), they may be represented with a predetermined scale factor $K_{scale}$ factored in. Thus, the filter coefficients 402, 404 may be defined as:

$$a_{1K}=\text{round}(a_1*K\text{scale}), \text{ and}$$

$$b_{1K}=\text{round}(b_1*K\text{scale}).$$

The pre-round output state value $y_{PreR}(n)$ may be computed as:

$$y_{PreR}(n)=a_{1K}*x(n)-b_{1K}*y(n-1).$$

The post-round output state value $y_{PostR}(n)$ may be computed as:

$$y_{PostR}(n)=\text{round}(y_{PreR}(n)/K_{scale}).$$

The filter output state value y(n) equals the post-round output state value $y_{PostR}(n)$ during times where no steady state error correction is applied.

To apply steady state error correction, the detect steady state module 406 of the filter 400 first determines whether the filter output state vector has settled to a steady state value. Since the filter 400 is a fixed point recursive filter, its steady state value has a nonzero steady state error associated with it that should be reduced or eliminated. The detect steady state module 406 determines that the filter has achieved a steady state by determining that the filter output state vector at time n is equal to the filter output steady state vector at time n−1. Thus, if y(n)=y(n−1), then a steady state value detected message is transmitted from the detect steady state module 406 to the drift term module 408.

In other aspects of the disclosure, the detect steady state module 406 may determine that a steady state value has been achieved only when three or more consecutive filter output state vectors are equivalent to one another. For example, the detect steady state module 406 may transmit a steady state value detected message to the drift term module 408 only when y(n)=y(n−1)= . . . =y(n−h) where h equals any integer equal to or greater than two (2). Otherwise, if no steady state value is detected, the detect steady state module 406 may transmit a no steady state value detected message to the drift term module 408, and thus no steady state error correction is applied to the filter output state value.

If a steady state value is detected by the detect steady state module 406, then the drift term module 408 may calculate drift terms that are used to reduce the steady state error of the filter. A drift term may be calculated according to the following equation:

$$\text{drift term }(n) = \begin{cases} 1 & \text{if } yPreR(n) > yPost(n) * Kscale \\ 0 & \text{if } yPreR(n) = yPost(n) * Kscale \\ -1 & \text{if } yPreR(n) < yPost(n) * Kscale \end{cases}$$

The drift term is then added to the filter output state value. Thus, the steady state adjusted filter output state value y(n) =drift term(n)+$y_{PostR}(n)$.

Two Tap Recursive Filter

Figure 5:
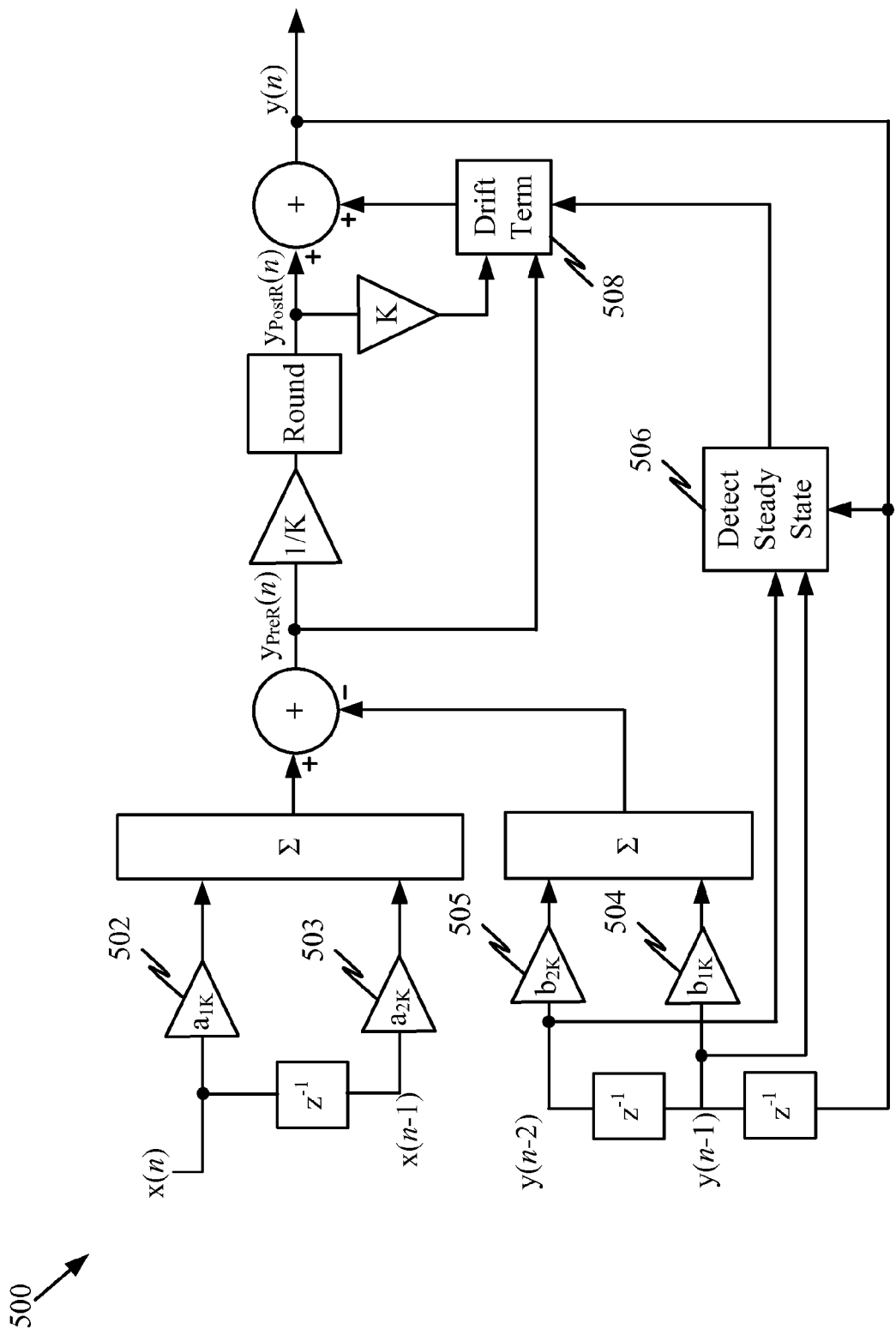
FIG. 5 illustrates an example of a two-tap recursive filter featuring steady state error correction.

FIG. 5 illustrates an example of a functional block diagram of a fixed point, two-tap recursive filter 500 with steady state error correction according to one aspect of the disclosure. As an example, the difference equation of a two tap recursive filter may be defined as:

$$y(n)=a_1*x(n)+a_2*x(n-1)-b_1*y(n-1)-b_2*y(n-2).$$

The filter output state vector (FOSVec) of the two tap recursive filter may be given at time n as the tuple:

$$\text{FOSVec}(n)=[y(n),y(n-1)].$$

The filter output state vector (FOSVec) of the two tap recursive filter may be given at time n−1 as the tuple:

$$\text{FOSVec}(n-1)=[y(n-1),y(n-2)].$$

At time n, y(n) may be calculated based on FOSVec(n−1) and the input x(n). Referring to FIG. 5, since the filter coefficients $a_1$, $a_2$, $b_1$, $b_2$ may be less than one (1), they may be represented with a predetermined scale factor $K_{scale}$ factored in. Thus, the filter coefficients 502, 503, 504, 505 may be defined as:

$$a_{1K}=\text{round}(a_1*K\text{scale}),$$

$$a_{2K}=\text{round}(a_2*K\text{scale}),$$

$$b_{1K}=\text{round}(b_1*K\text{scale}), \text{ and}$$

$$b_{2K}=\text{round}(b_2*K\text{scale}).$$

The pre-round output state value $y_{PreR}(n)$ may be computed as:

$$y_{PreR}(n)=a_{1K}*x(n)+a_{2K}*x(n-1)-b_{1K}*y(n-1)-b_{2K}*y(n-2).$$

The post-round output state value $y_{PostR}(n)$ may be computed as:

$$y_{PostR}(n)=\text{round}(y_{PreR}(n)/K_{scale}).$$

The filter output state value y(n) may equal the post-round output state value $y_{PostR}(n)$ during times where no steady state error correction is applied.

To apply steady state error correction, the detect steady state module 506 of the filter 500 first determines that the filter output state vector has settled to a steady state value. Since the filter 500 is a fixed point recursive filter, this steady state value has a nonzero steady state error associated with it that should be reduced or eliminated. The detect steady state module 506 determines that the filter has achieved a steady state by determining that FOSVec(n) is equal to FOSVec(n−1). Thus, if y(n)=y(n−1)=y(n−2), then a steady state value detected message is transmitted from the detect steady state module 506 to the drift term module 508.

In other aspects of the disclosure, the detect steady state module 506 may determine that a steady state value has been achieved only when three or more consecutive filter output state vectors (e.g., FOSVec(n), FOSVec(n−1), and FOSVec(n−2)) are equivalent to one another. For example, the detect steady state module 506 may transmit a steady state value detected message to the drift term module 508 only when y(n)=y(n−1)=y(n−2)= . . . =y(n−h) where h equals any integer equal to or greater than three (3). Otherwise, if no steady state value is detected, the detect steady state module 506 may transmit a no steady state value detected message to the drift term module 508, and thus no steady state error correction is applied to the filter output state value.

If a steady state value is detected by the detect steady state module 506, then the drift term module 508 may calculate drift terms that are used to reduce the steady state error of the filter. A drift term may be calculated according to the following equation:

$$\text{drift term } (n) = \begin{cases} 1 & \text{if } yPreR(n) > yPost(n) * Kscale \\ 0 & \text{if } yPreR(n) = yPost(n) * Kscale \\ -1 & \text{if } yPreR(n) < yPost(n) * Kscale \end{cases}$$

The drift term is then added to the filter output state value. Thus, the steady state adjusted filter output state value y(n)=drift term(n)+$y_{PostR}$(n).

Exemplary Performance Results

Figure 6:
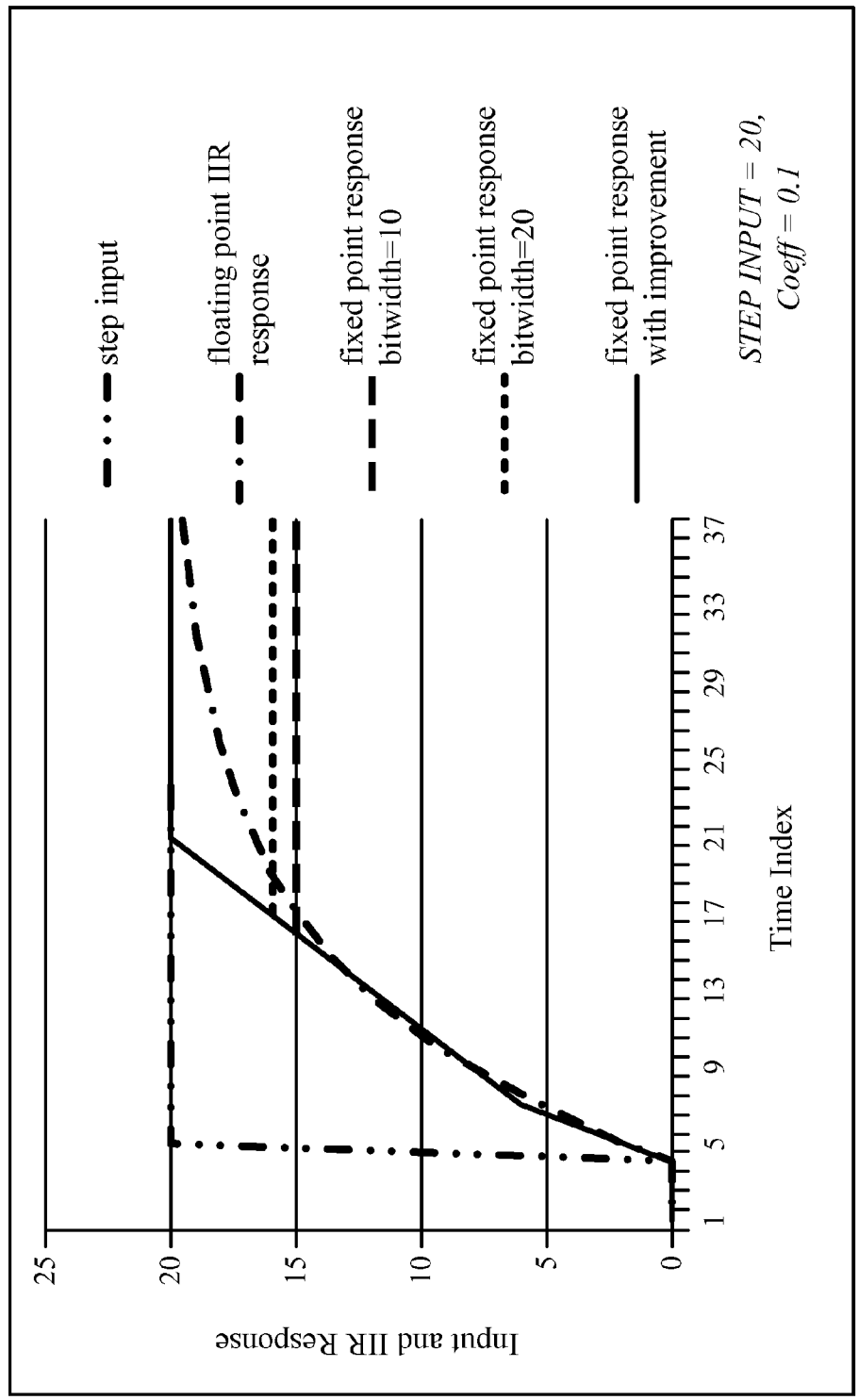
FIGS. 6-8 illustrate exemplary step responses of various recursive filters.
Figure 7:
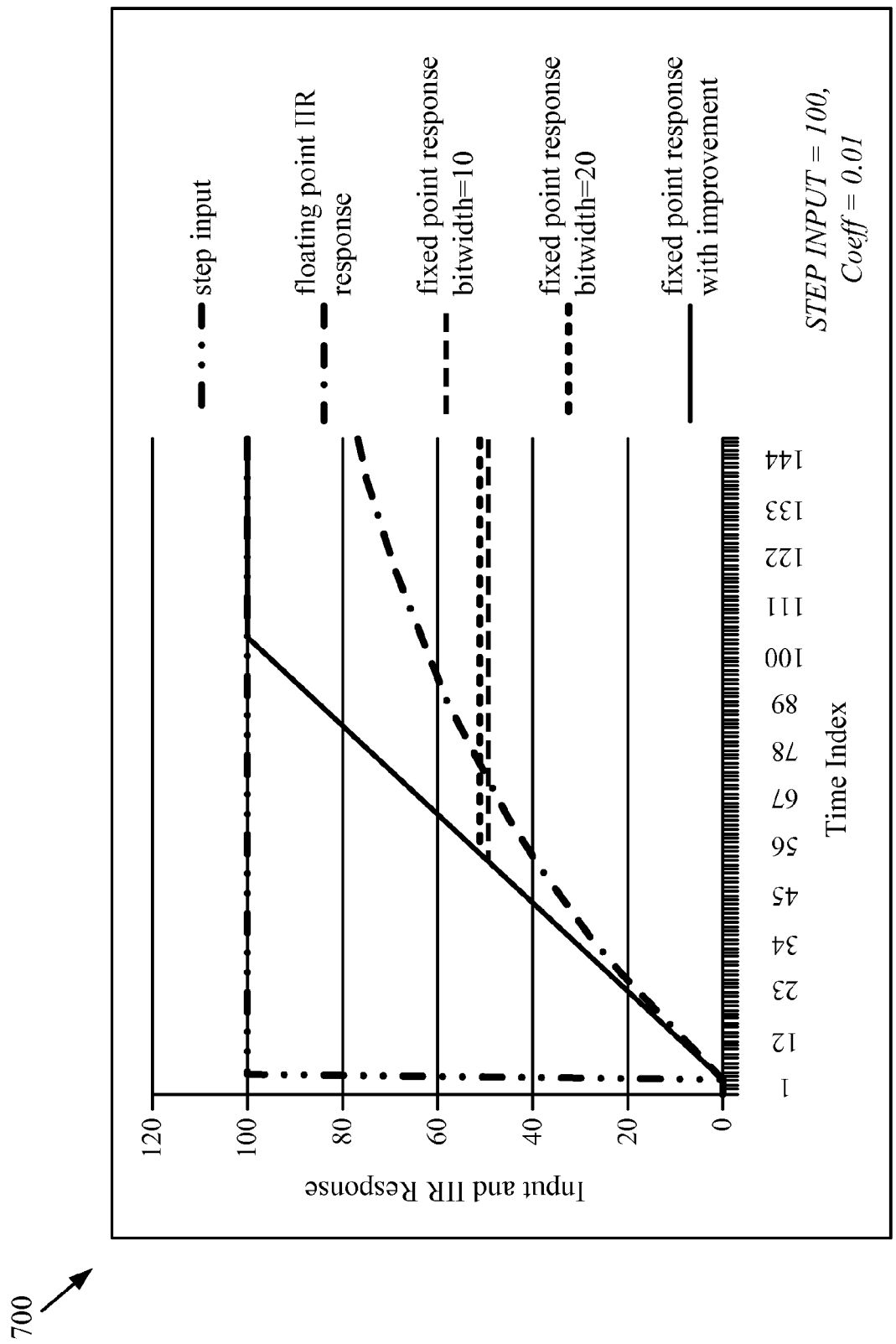
Figure 8:
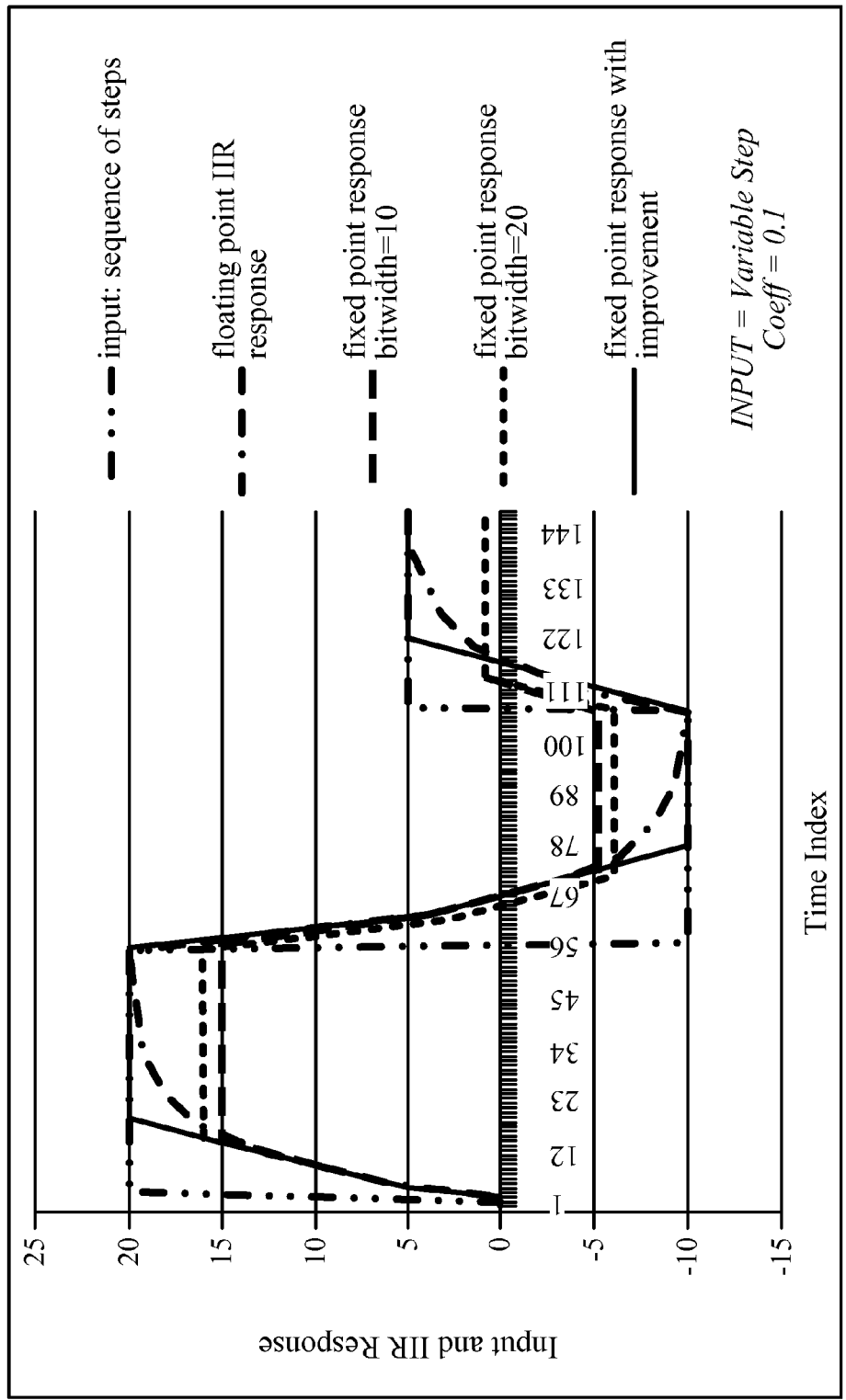

FIGS. 6-8 illustrate exemplary improvements that may be achieved using the steady state error correction methods disclosed herein for a single tap recursive filter of the following type:

$$y(n) = \text{coeff} * x(n) + (1 - \text{coeff}) * y(n-1),$$

FIG. 6 illustrates exemplary filter responses where the input x(n) is a step input having a value of 20, and coeff=0.1. FIG. 7 illustrates filter responses where the input x(n) is a step input having a value of 100, and coeff=0.01. FIG. 8 illustrates filter responses where the input x(n) is a series of step values, and coeff=0.1.

Each of the FIGS. 6-8 show different response plots 600, 700, 800 according to the following filter properties:

"Floating point IIR response"—shows the filter response when the filter is implemented in floating point;

"Fixed Point Response Bit-width 10"—shows the filter response without any steady state error correction where the $K_{scale}$ value is $2^{10}$, i.e., an additional bit-width of 10 bits has been used to calculate the intermediates and pre-round output state value;

"Fixed Point Response Bit-width 20"—shows the filter response without any steady state error correction where the $K_{scale}$ value is $2^{20}$, i.e., an additional bit-width of 20 bits has been used to calculate the intermediates and pre-round output state value;

"Fixed Point Response with Improvement"—shows the filter response with the addition of the steady state error correction methods disclosed herein.

Referring to FIG. 6, the fixed point implementations having no steady state error correction have responses that settle at values that are lower than the desired value twenty (20). For example, the steady state error for the 10 bit $K_{scale}$ implementation is about five (5), and the error for the 20 bit $K_{scale}$ implementation is about four (4). Thus, increasing the $K_{scale}$ bit-width for the intermediates in the filtering operation does not resolve the steady state error problem, and the steady state error continues to be non-zero even when the $K_{scale}$ bit-width is doubled from 10 bits to 20 bits. By contrast, the fixed point implementation with the steady state error correction settles at the desired value twenty (20), and thus has no steady state error. The fixed point implementation with the steady state error correction even settles to the desired output value faster than the floating point implementation.

Referring to FIG. 7, similar results to those of FIG. 6 may be observed. Specifically, the fixed point implementations having no steady state error correction have responses that settle at values that are lower than the desired value one hundred (100). For example, increasing the $K_{scale}$ bit-width for the intermediates in the filtering operation does not resolve the steady state error problem, and the steady state error continues to be non-zero even when the $K_{scale}$ bit-width is doubled from 10 bits to 20 bits. By contrast, the fixed point implementation with the steady state error correction settles at the desired value one hundred (100), and thus has no steady state error. The fixed point implementation with the steady state error correction even settles to the desired output value faster than the floating point implementation.

Referring to FIG. 8, similar results to that of FIGS. 6 and 7 may be observed. Namely, the fixed point implementation having steady state error correction outperform the traditional fixed point recursive filter implementations having no steady state error correction.

Exemplary Implementation—Accurate CQI Reporting in Tunnel Environments

Universal Mobile Telecommunications System (UMTS) is a third generation mobile cellular technology for networks based on the GSM standard. UMTS (3GPP release 5 and greater) employs feedback methods referred to as CQI (channel quality information/indicator). The intent is for the mobile device/data-card user equipment (UE) to measure the channel quality on the downlink (signals transmitted from the network to the UE) in a reference time period, and to report these quality metrics in a pre-determined fashion to the network on the uplink (signals transmitted from the UE to the network). The CQI reports are periodically transmitted on the uplink by the UE to the network for successive reference time periods. As one example, the network may factor the channel quality reports from all the users in a cell into decisions on resource allocation and scheduling. There are slight variants in the specific manner that the CQI is reported for non-multiple input multiple output (MIMO) High Speed Packet Access (HSPA), non-MIMO HSPA space time transmit diversity (STTD), non-MIMO HSPA closed loop transmit diversity (CLTD), MIMO HSPA, and long term evolution (LTE). However, in all cases, the user equipment (UE) monitors the downlink channel quality, translates this information into CQI data which may be a single value, or collection of values, and transmits this CQI data to the network.

"Tunnel environments" are cellular environments experienced by users where the channel quality starts high, but then rapidly degrades, and then ends high again. This may be caused, for example, when a user passes through a tunnel. The signal to noise (SNR) ratio may be high just outside of the tunnel, but as the user enters deeper into the tunnel, the SNR drops because of the lack of signal reception. Then, as the user begins to exit the tunnel, the SNR again rises as signal reception increases. Such phenomena is not restricted to tunnels, but instead may also include environments such as "urban canyons," which include narrow corridors between tall buildings.

In tunnel environments, the channel quality may temporarily become extremely poor. Such environments have a significant impact on user experience because under normal circumstances, such low levels of signal-to-noise (SNR) may be insufficient to maintain a reasonable data rate and/or connection. However, it behooves the UE to report the channel quality accurately under such conditions and maintain the call since the channel conditions are expected to dramatically improve as the UE exits the tunnel environment. Reporting accurate CQI in tunnel environments is more challenging in 3GPP Release 8 and greater since these releases support dual carriers. The UE could experience a tunnel environment in one carrier and have a reasonable channel on the other carrier. In this situation, it is particularly important that the UE report accurate CQI on both carriers.

Recursive filters may be used in wireless communication devices, such as mobile phones, smart-phones, laptops, etc. to estimate signal levels received from a network. For example, a recursive filter may be used to obtain an energy estimate of a received common pilot channel (CPICH) symbol stream. These filters may be implemented in fixed point hardware implementations for improved speed and power conservation reasons. However, as discussed above, such fixed point implementations suffer from steady state errors. These steady state errors become significant in tunnel environments since the received signal level is weak and thus the corresponding filter output state values are small. Thus, steady state errors in tunnel environments may lead to incorrect CPICH signal to noise (SNR) estimation, and consequently incorrect SNR to CQI mapping.

Figure 9:
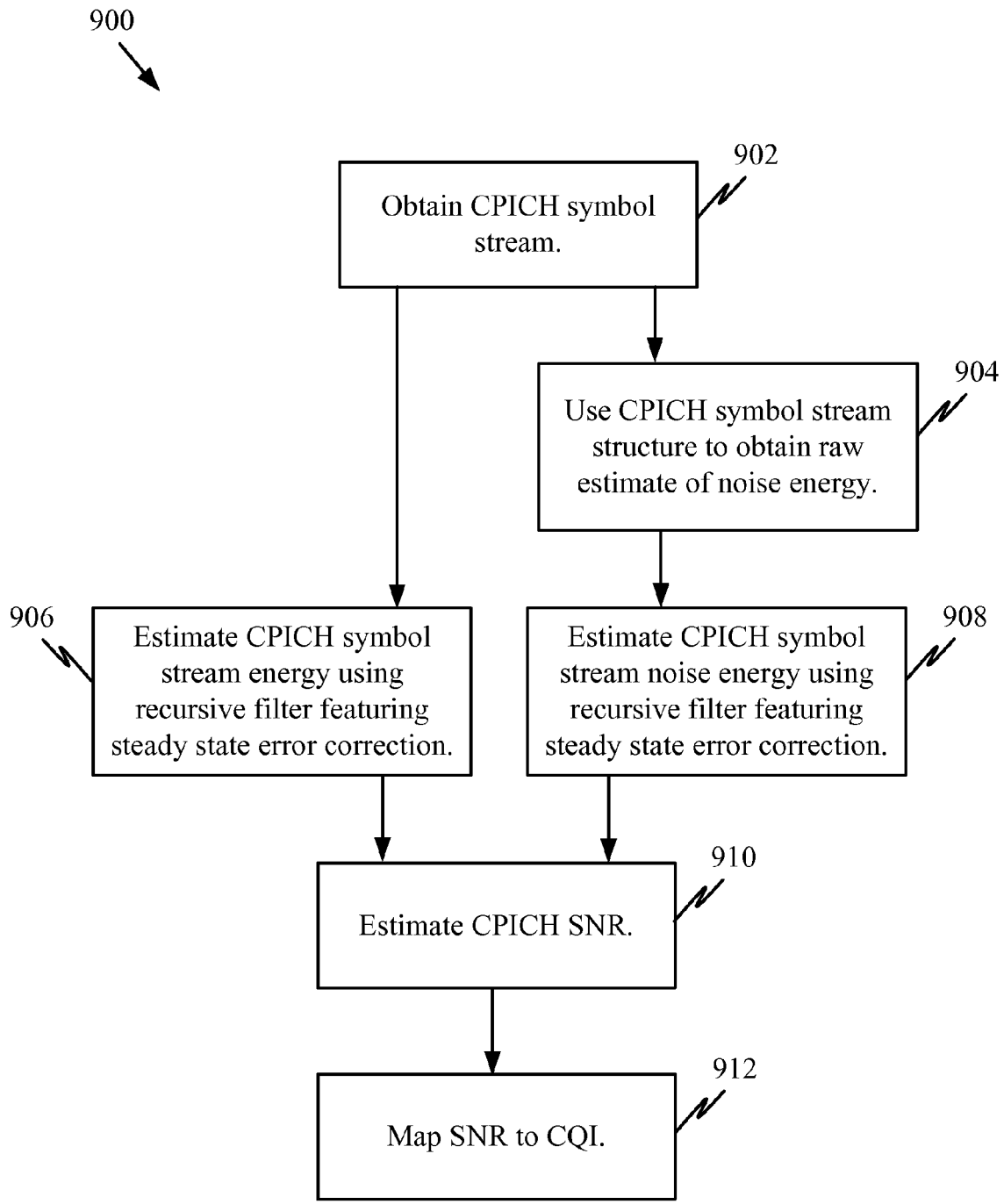
FIG. 9 is a flowchart illustrating an exemplary method for computing a CQI operational at a mobile device.

FIG. 9 is a flowchart 900 illustrating a method for computing a CQI operational at a mobile device (e.g., mobile phone, laptop, smartphone, etc.) according to one aspect of the disclosure. First, the CPICH symbol stream is obtained 902. Then, the CPICH symbol stream structure is used to obtain raw estimates of the noise energy of the symbol stream 904. Then, the energy of the CPICH symbol stream is estimated using a recursive filter featuring the steady state error correction methods disclosed herein 906. Since the enhanced recursive filter featuring steady state error correction reduces the steady state error of the filter, a more accurate and reliable energy estimate of the CPICH symbol stream is achieved. Next, the raw estimate of the noise energy of the CPICH symbol stream is used as input to a recursive filter also featuring steady state error correction. The recursive filter featuring steady state error correction may accurately estimate the noise the energy of the CPICH symbol stream 908. The energy estimates of the CPICH symbol stream and the associated noise of the CPICH symbol stream are used to estimate the SNR of the communications channel 910. The SNR value is then mapped to a CQI value 912, which may then be reported to the network. In one aspect of the disclosure, the recursive filters having low or no steady state error help identify tunnel environments, which may then be used to transmit a predefined CQI value to the network indicative of a tunnel environment. The mobile device and/or network may then know not to sever communications with each other since the SNR values of the communications link between the mobile device and the network is expected to improve once the mobile device exits the tunnel environment.

Exemplary Mobile Device

Figure 10:
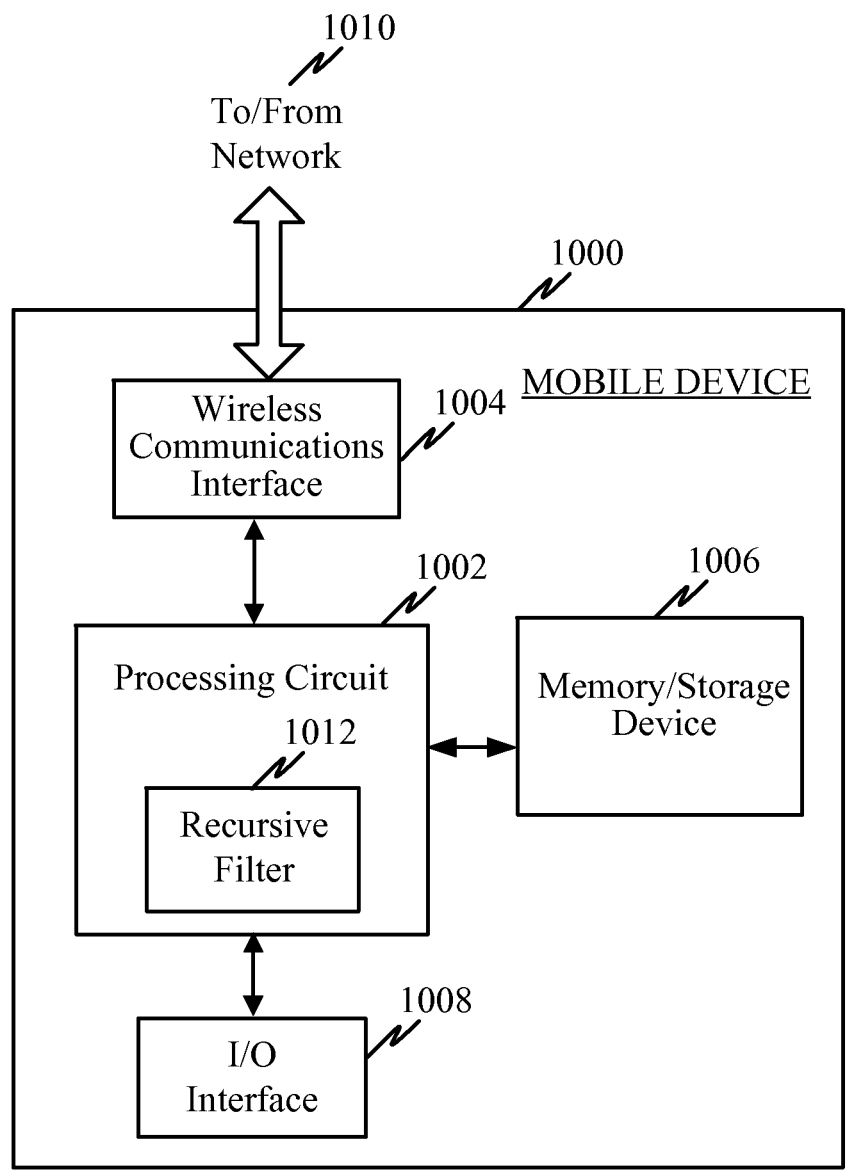
FIG. 10 is an exemplary functional block diagram of a mobile device featuring a recursive filter having steady state error correction.

FIG. 10 is a functional block diagram illustrating a mobile device 1000 that may implement a recursive filter adapted to reduce steady state error according to one aspect of the disclosure. The mobile device 1000 may be any wireless communications device, such as but not limited to, a mobile phone, a smartphone, a laptop, data card, etc. The mobile device 1000 may include a processing circuit 1002 communicatively coupled to a wireless communications interface (e.g., a transceiver circuit) 1004, a memory/storage device 1006 (e.g., memory device, memory circuit, Flash storage, DDR SDRAM, etc.), and/or a user input/output (I/O) interface 1008 (e.g., microphone, speaker(s), display screen, pointer device, keypad, etc.). The processing circuit 1002 may include one or more processors, circuits, and/or modules that are adapted, configured, and/or programmed to perform one or more operations or functions of the mobile device, such as establishing, maintaining, and/or performing communications over the network. Moreover, the processing circuit 1002 may implement any one of the recursive filters 1012 featuring steady state error correction disclosed herein (e.g., FIGS. 3, 4, 5), and perform the algorithms shown in FIGS. 3, 9, and 11. In other aspects of the disclosure, the recursive filter 1012 may be a dedicated, specialized ASIC independent from the processor 1002. The wireless communication interface 1004 may allow the mobile device 1000 to communicate to/from a serving network 1010. The memory circuit 1006 may be adapted to store the algorithms shown in FIGS. 3, 9, and 11 for execution by the processor 1002.

Figure 11:
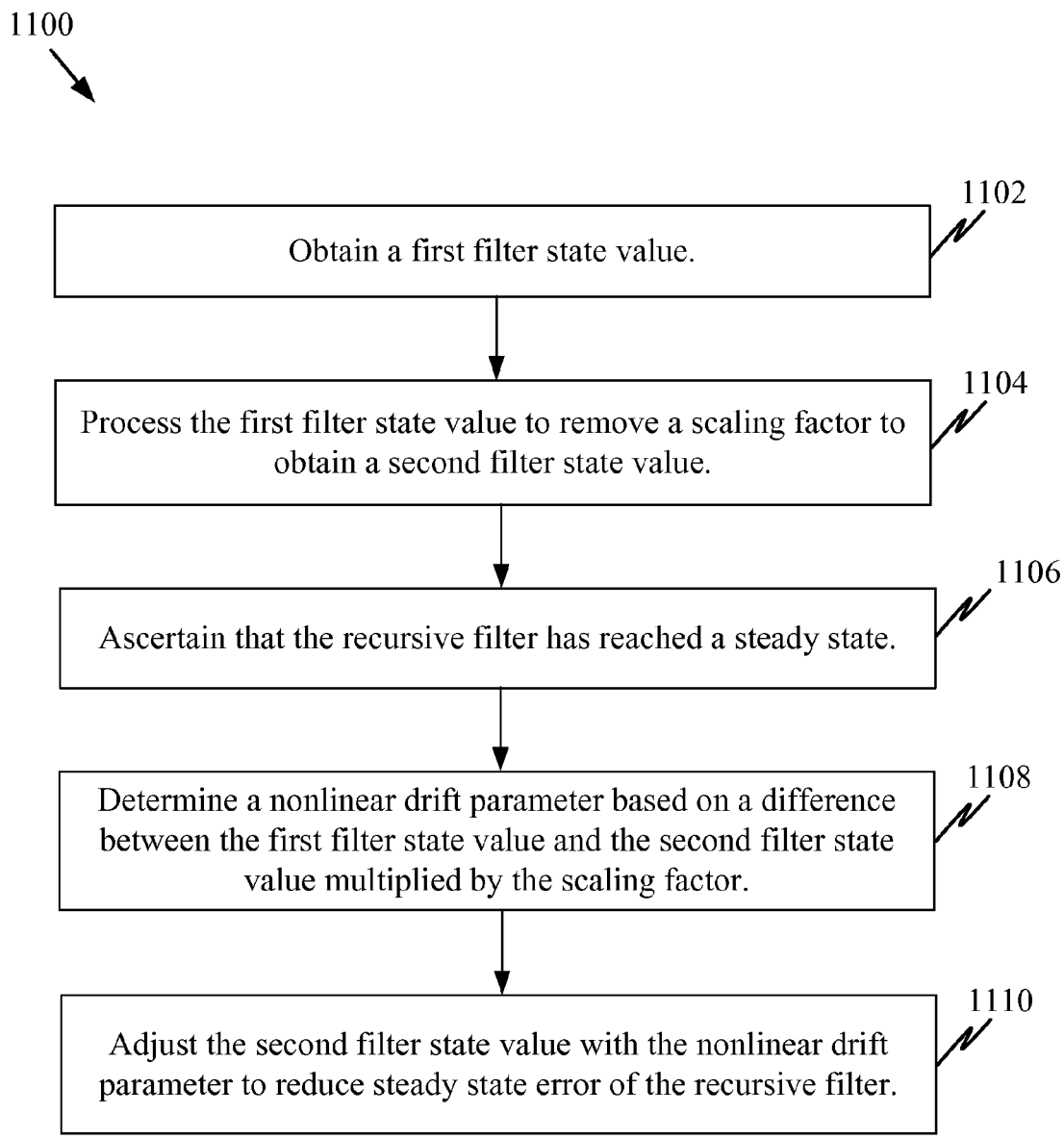
FIG. 11 is an exemplary method for reducing steady state error in a recursive filter.

FIG. 11 illustrates a method 1100 operational in a recursive filter according to one aspect of the disclosure. First, a first filter state value is obtained 1102. Then, the first filter state value is processed to remove a scaling factor to obtain a second filter state value 1104. Next, it may be ascertained that the recursive filter has reached a steady state 1106. Then, a nonlinear drift parameter is determined based on a difference between the first filter state value and the second filter state value multiplied by the scaling factor 1108. Next, the second filter state value is adjusted with the nonlinear drift parameter to reduce steady state error of the recursive filter 1110.

One or more of the components, steps, features and/or functions illustrated in FIGS. 3, 4, 5, 6, 7, 8, 9, 10 and/or 11 may be rearranged and/or combined into a single component, step, feature or function or embodied in several components, steps, or functions. Additional elements, components, steps, and/or functions may also be added without departing from the invention. The apparatus, devices, and/or components illustrated in FIGS. 4, 5 and/or 10 may be configured to perform one or more of the methods, features, or steps described in FIGS. 3, 6, 7, 8, 9, and/or 11. The algorithms described herein may also be efficiently implemented in software and/or embedded in hardware.

Moreover, in one aspect of the disclosure, the filter 400 illustrated in FIG. 4 and the filter 500 illustrated in FIG. 5 may be specialized circuits (e.g., ASICs) that are physically constructed to perform recursive filtering featuring steady state error correction. Moreover, in another aspect, the processor 1002 and/or the recursive filter 1012 shown in FIG. 10 may be specialized circuits (e.g., ASICs) that are physically constructed to perform the schematics, algorithms, methods, and/or steps illustrated/described in FIGS. 3, 4, 5, 9, and/or 11. Additionally, the memory circuit 1006 shown in FIG. 10 may store processor 1002 readable instructions that when executed by the specialized processor 1002 causes the processor 1002 to perform the schematics, algorithms, methods, and/or steps described in FIGS. 3, 4, 5, 9, and/or 11.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine-readable mediums and, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing, containing or carrying instruction(s) and/or data. Thus, the various methods described herein may be fully or partially implemented by instructions and/or data that may be stored in a "machine-readable medium", "computer-readable medium", and/or "processor-readable medium" and executed by one or more processors, machines and/or devices.

Furthermore, aspects of the disclosure may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A method for implementing a recursive filter, comprising:
    obtaining a first filter state value;
    processing the first filter state value to remove a scaling factor to obtain a second filter state value;
    ascertaining that the recursive filter has reached a steady state;
    determining a nonlinear drift parameter based on a difference between the first filter state value and the second filter state value multiplied by the scaling factor; and
    adjusting the second filter state value with the nonlinear drift parameter to reduce steady state error of the recursive filter.

2. The method of claim 1, wherein processing the first filter state value to obtain the second filter state value includes rounding the first filter state value after removing the scaling factor.

3. The method of claim 1, wherein ascertaining that the recursive filter has reached the steady state includes:
    determining that a filter output value at time n is equal to a filter output value at time n−1.

4. The method of claim 1, wherein ascertaining that the recursive filter has reached the steady state includes:
    obtaining a first filter vector comprising a first plurality of filter values for a time n−1;
    obtaining a second filter vector comprising a second plurality of filter values for a time n; and
    determining that the first filter state vector is equal to the second filter state vector.

5. The method of claim 1, wherein adjusting the second filter state value with the nonlinear drift parameter includes:
    adding the drift parameter to the second filter state value.

6. The method of claim 1, wherein determining the nonlinear drift parameter based on the difference between the first filter state value and the second filter state value multiplied by the scaling factor includes:
    setting the drift parameter equal to a bit value of positive one (1) if the first filter state value minus the second filter state value multiplied by the scaling factor is greater than zero (0); and
    setting the drift parameter equal to a bit value of negative one (−1) if the first filter state value minus the second filter state value multiplied by the scaling factor is less than zero (0).

7. The method of claim 1, wherein obtaining the first filter state value includes:
    multiplying an input value by a first coefficient to obtain a first intermediate value;

multiplying a filter output value at time n−1 by a second coefficient to obtain a second intermediate value; and subtracting the second intermediate value from the first intermediate value.

8. The method of claim 1, wherein the recursive filter is used in a mobile device to accurately report a CQI value to a communications network.

9. The method of claim 1, wherein the recursive filter is used in a UMTS user equipment to determine an SNR value of a communications link between the user equipment and a communications network.

10. The method of claim 1, wherein the recursive filter is a fixed point recursive filter.

11. The method of claim 1, wherein adjusting the second filter state value with the nonlinear drift parameter to reduce steady state error of the recursive filter is performed without changing the order of the recursive filter.

12. The method of claim 1, further comprising:
obtaining an input value; and
multiplying the input value and one or more filter coefficients to obtain one or more intermediate values.

13. The method of claim 12, further comprising:
combining the one or more intermediate values to generate the first state value.

14. A recursive filter, comprising:
a processing circuit adapted to
obtain a first filter state value,
process the first filter state value to remove a scaling factor to obtain a second filter state value,
ascertain that the recursive filter has reached a steady state,
determine a nonlinear drift parameter based on a difference between the first filter state value and the second filter state value multiplied by the scaling factor, and
adjust the second filter state value with the nonlinear drift parameter to reduce steady state error of the recursive filter.

15. The recursive filter of claim 14, wherein determining the nonlinear drift parameter based on the difference between the first filter state value and the second filter state value multiplied by the scaling factor includes:
setting the drift parameter equal to a bit value of positive one (1) if the first filter state value minus the second filter state value multiplied by the scaling factor is greater than zero (0); and
setting the drift parameter equal to a bit value of negative one (−1) if the first filter state value minus the second filter state value multiplied by the scaling factor is less than zero (0).

16. The recursive filter of claim 14, wherein ascertaining that the recursive filter has reached the steady state includes:
obtaining a first filter vector comprising a first plurality of filter values for a time n−1;
obtaining a second filter vector comprising a second plurality of filter values for a time n; and
determining that the first filter state vector is equal to the second filter state vector.

17. A recursive filter, comprising:
means for obtaining a first filter state value;
means for processing the first filter state value to remove a scaling factor to obtain a second filter state value;
means for ascertaining that the recursive filter has reached a steady state;

means for determining a nonlinear drift parameter based on a difference between the first filter state value and the second filter state value multiplied by the scaling factor; and
means for adjusting the second filter state value with the nonlinear drift parameter to reduce steady state error of the recursive filter.

18. The recursive filter of claim 17, wherein the means for determining the nonlinear drift parameter based on the difference between the first filter state value and the second filter state value multiplied by the scaling factor includes:
means for setting the drift parameter equal to a bit value of positive one (1) if the first filter state value minus the second filter state value multiplied by the scaling factor is greater than zero (0); and
means for setting the drift parameter equal to a bit value of negative one (−1) if the first filter state value minus the second filter state value multiplied by the scaling factor is less than zero (0).

19. The recursive filter of claim 17, wherein the means for ascertaining that the recursive filter has reached the steady state includes:
means for obtaining a first filter vector comprising a first plurality of filter values for a time n−1;
means for obtaining a second filter vector comprising a second plurality of filter values for a time n; and
means for determining that the first filter state vector is equal to the second filter state vector.

20. A non-transitory computer readable medium having instructions stored thereon for implementing a recursive filter, which when executed by one or more processors causes the processor to:
obtain a first filter state value;
process the first filter state value to remove a scaling factor to obtain a second filter state value;
ascertain that the recursive filter has reached a steady state;
determine a nonlinear drift parameter based on a difference between the first filter state value and the second filter state value multiplied by the scaling factor; and
adjust the second filter state value with the nonlinear drift parameter to reduce steady state error of the recursive filter.

21. The non-transitory computer readable medium of claim 20, wherein determining the nonlinear drift parameter based on the difference between the first filter state value and the second filter state value multiplied by the scaling factor includes:
setting the drift parameter equal to a bit value of positive one (1) if the first filter state value minus the second filter state value multiplied by the scaling factor is greater than zero (0); and
setting the drift parameter equal to a bit value of negative one (−1) if the first filter state value minus the second filter state value multiplied by the scaling factor is less than zero (0).

22. The non-transitory computer readable medium of claim 20, wherein ascertaining that the recursive filter has reached the steady state includes:
obtaining a first filter vector comprising a first plurality of filter values for a time n−1;
obtaining a second filter vector comprising a second plurality of filter values for a time n; and
determining that the first filter state vector is equal to the second filter state vector.

* * * * *